United States Patent
Ikeda

(10) Patent No.: US 7,633,831 B2
(45) Date of Patent: Dec. 15, 2009

(54) SEMICONDUCTOR MEMORY AND OPERATING METHOD OF SAME

(75) Inventor: Hitoshi Ikeda, Kawasaki (JP)

(73) Assignee: Fujitsu Microelectronics Ltd., Tokyo (JP)

( * ) Notice: Subject to any disclaimer, the term of this patent is extended or adjusted under 35 U.S.C. 154(b) by 237 days.

(21) Appl. No.: 11/797,816

(22) Filed: May 8, 2007

(65) Prior Publication Data

US 2007/0268772 A1    Nov. 22, 2007

(30) Foreign Application Priority Data

May 18, 2006    (JP)    .............................. 2006-138839

(51) Int. Cl.
*G11C 8/00*    (2006.01)
(52) U.S. Cl. ...................... 365/233; 365/190; 365/202; 365/203
(58) Field of Classification Search ................. 365/233, 365/190, 202, 203
See application file for complete search history.

(56) References Cited

U.S. PATENT DOCUMENTS

| | | | |
|---|---|---|---|
| 5,479,635 A | | 12/1995 | Kametani |
| 5,894,312 A | * | 4/1999 | Ishiwata et al. ............. 345/504 |
| 6,061,297 A | * | 5/2000 | Suzuki ..................... 365/238.5 |
| 6,442,088 B1 | * | 8/2002 | Tsuchida et al. ............ 365/203 |
| 2003/0031073 A1 | | 2/2003 | Yahata et al. |
| 2004/0165472 A1 | | 8/2004 | Yamazaki |
| 2005/0068843 A1 | | 3/2005 | Takeuchi |
| 2005/0078506 A1 | | 4/2005 | Rao et al. |

FOREIGN PATENT DOCUMENTS

| | | |
|---|---|---|
| JP | 2003-59264 | 2/2003 |
| JP | 2004-259318 | 9/2004 |

* cited by examiner

*Primary Examiner*—Connie C Yoha
(74) *Attorney, Agent, or Firm*—Arent Fox LLP

(57) ABSTRACT

An operation control circuit carries out a first access operation upon receipt of a first access command during activation of a chip enable signal, and carries out a second access operation accessing a memory core in a shorter time than the first access operation, upon receipt of the next access command during activation of the chip enable signal. For this reason, two types of access operations whose access times differ can be carried out by receiving the same access command at the same access terminal. A dedicated terminal for distinguishing between the two types of operations does not need to be formed in a controller, etc., which accesses a semiconductor memory. Selective use of the first and second access operations improves the operation efficiency of the semiconductor memory. Consequently, the operation efficiency of the semiconductor memory can be improved without increasing the cost of a system incorporating the semiconductor memory.

18 Claims, 14 Drawing Sheets

SEMICONDUCTOR MEMORY AND OPERATING METHOD OF SAME

CROSS REFERENCE TO RELATED APPLICATION

This application is based upon and claims the benefit of priority from Japanese Patent Application No. 2006-138839, filed on May 18, 2006, the entire contents of which are incorporated herein by reference.

BACKGROUND OF THE INVENTION

1. Field of the Invention

The present invention relates to a semiconductor memory having a memory cell of DRAM and an interface of SRAM.

2. Description of the Related Art

In recent years, a semiconductor memory called a pseudo SRAM (Pseudo-SRAM) has been developed. The pseudo SRAM has a memory cell of DRAM (dynamic memory cell) and operates as a SRAM carrying out a refresh operation of the memory cell internally and automatically. The dynamic memory cell used in the pseudo SRAM has a small area. For this reason, a large capacity pseudo SRAM with a low bit cost can be developed.

The pseudo SRAM has an interface of SRAM. In synchronization with an access command, an address is received at once and a write access operation and a read access operation are carried out. A controller which accesses the pseudo SRAM needs to inactivate a chip enable signal each time the address is changed. Therefore, the pseudo SRAM can not carry out the write access operation or the read access operation continuously while a part of the address is held. For this reason, especially when memory cells are sequentially accessed using continuing addresses, the data transfer rate will decrease.

On the other hand, there is proposed a pseudo SRAM which carries out so called a page operation in response to a dedicated control signal when the memory cells are sequentially accessed using continuing addresses in the pseudo SRAM (e.g., Japanese Unexamined Patent Application No. 2004-259318). Here, the page operation is an operation of writing data to a memory cell sequentially or an operation of reading data from a memory cell sequentially by changing only column address while a word line is activated. By carrying out the page operation, the operation efficiency of the pseudo SRAM is improved and the data transfer rate is increased.

However, when carrying out the page operation using a dedicated control signal, a controller which accesses the pseudo SRAM needs to output the dedicated control signal. This does not allow the conventional controller to be used, and a dedicated controller needs to be developed for the pseudo SRAM capable of carrying out the page operation. As a result, the cost of a system incorporating the semiconductor memory will increase.

SUMMARY OF THE INVENTION

An object of the present invention is to improve the operation efficiency of a semiconductor memory without increasing the system cost.

In one aspect of the present invention, a semiconductor memory receives a chip enable signal allowing access to a memory core, receives an access command for carrying out the access operation to the memory core, and receives an address at once in accordance with the access command, the address being indicative of a memory cell to access. During activation of the chip enable signal, an operation control circuit carries out a first access operation upon receipt of the first access command. During the activation of the chip enable signal, the operation control circuit carries out a second access operation upon receipt of the next access command. The second access operation is shorter in time to access a memory core than the first access operation. For this reason, by receiving the same access command at the same access terminal, two types of access operations incorporating different access times can be carried out. A dedicated terminal distinguishing between the two types of operations does not need to be formed in a controller or the like which accesses the semiconductor memory. That is, the hardware, such as a controller, does not need to be changed. Selective use of the first and second access operations improves the operation efficiency of the semiconductor memory. As a result, the operation efficiency of the semiconductor memory can be improved without increasing the cost of a system incorporating the semiconductor memory.

In a preferred example in one aspect of the present invention, each bank has a memory core, an operation control circuit, and a data input/output circuit which inputs/outputs a data from/to the memory core in response to a data control signal, and these operate independently to each other. The operation control circuit of the bank to be accessed first stops outputting the data control signal in response to the output of a data control signal by the operation control circuit of the bank to be accessed next. For this reason, even when a plurality of banks operates concurrently, data can be inputted/outputted without collision. Also the operation efficiency of the semiconductor memory having a plurality of banks can be improved without forming a dedicated terminal.

[Effect of the Invention]

According to the present invention, the operation efficiency of a semiconductor memory can be improved without increasing the system cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
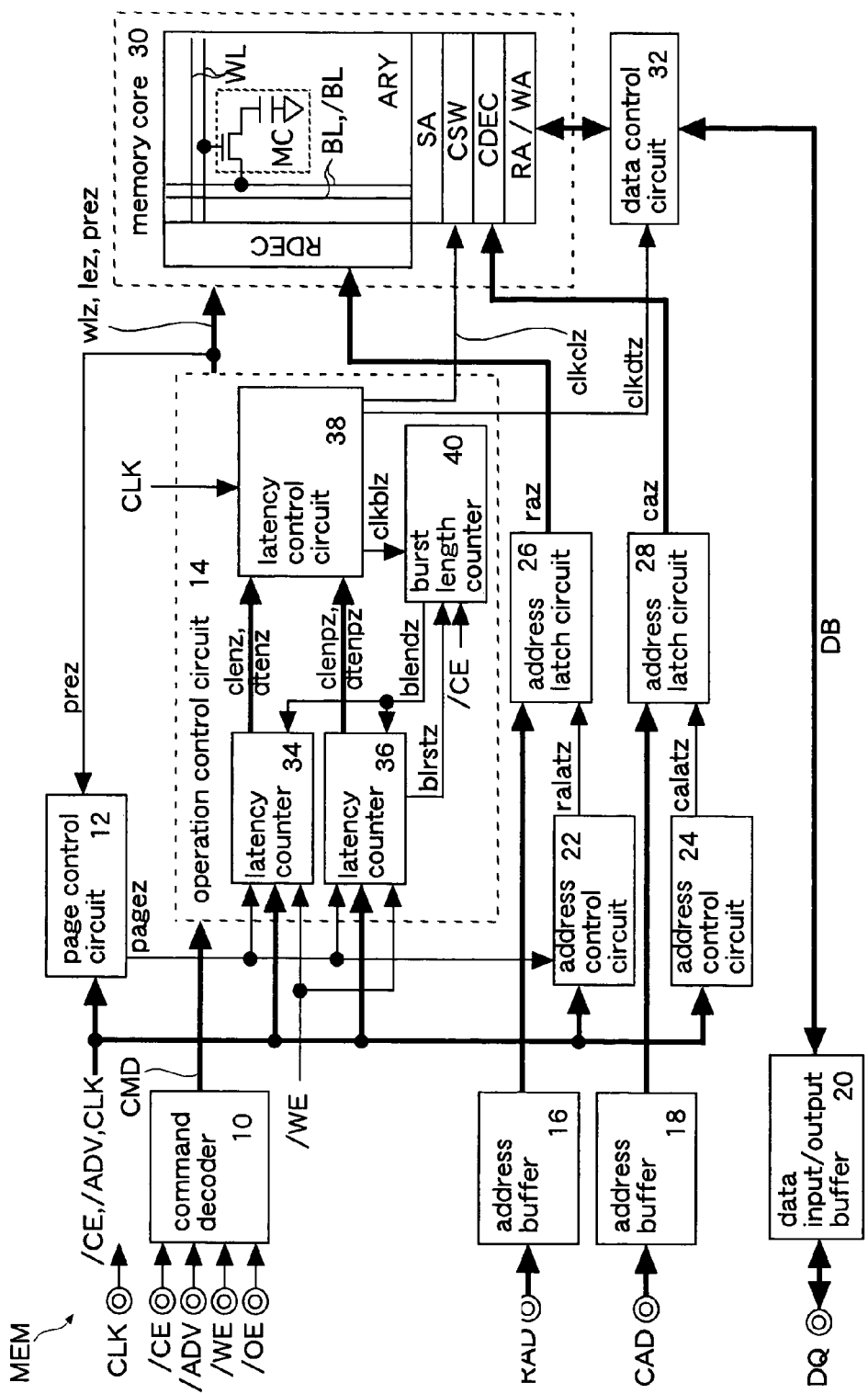
FIG. 1 is a block diagram showing a first embodiment of the present invention.

Hereinafter, embodiments of the present invention will be described using the accompanying drawings. The signal line illustrated with a thick line in the drawings consists of a plurality of lines. Moreover, a part of a block to which the thick line is connected consists of a plurality of circuits. For a signal line through which a signal is transmitted, the same symbol as the signal name is used. A signal beginning with "/" indicates a negative logic. A signal ending with "Z" indicates a positive logic. A double circle in the drawings indicates an external terminal.

FIG. 1 shows a first embodiment of the present invention. A semiconductor memory MEM is an FCRAM (Fast Cycle RAM) of a clock synchronization type which operates in synchronization with an external clock CLK, for example. The FCRAM is a pseudo SRAM having a memory cell of DRAM and having an interface of SRAM. The memory MEM has a command decoder 10, a page control circuit 12, an operation control circuit 14, address buffers 16 and 18, a data input/output buffer 20, address control circuits 22 and 24, address latch circuits 26 and 28, a memory core 30, and a data control circuit 32. The FCRAM receives the clock CLK at a clock terminal and supplies the received clock CLK to each circuit block via a non-illustrated clock buffer.

Although not specifically illustrated, the FCRAM has a refresh timer which generates a refresh request periodically, an address counter which generates a refresh address sequentially in response to the refresh request, and a refresh control circuit for carrying out a refresh operation during a non-operation period of the memory core 30 (during the inactivation period of a chip enable signal /CE). The refresh control circuit operates also as an arbiter which determines the priority between an external access request and the refresh request. The memory cell MC needs to be refreshed within a predetermined period in order to hold the data. For this reason, a maximum value of the activation period of the chip enable signal /CE is preset as an electrical specification. The details of the refresh operation are omitted because the present invention is not directly related to the refresh operation.

A command decoder 10 outputs a command, which is recognized corresponding to the logic levels of the chip enable signal /CE, address valid signal /ADV, write enable signal /WE, and output enable signal /OE, as an access command CMD for carrying out an access operation to the memory core 30. The access command CMD includes a write access command, a read access command, and the like. The chip enable signal /CE is an enable signal allowing access to the memory core 30. A chip enable terminal /CE functions as an enable terminal for receiving the enable signal. An address valid terminal /ADV, a write enable terminal /WE, and an output enable terminal /OE function as command terminals for receiving the access command. In the description hereinafter, the chip enable signal /CE is also referred to as a /CE signal, and the write enable signal /WE as a /WE signal, for example.

The page control circuit 12 activates a page signal pagez to a high level in synchronization with a CLK signal while the /CE signal and the /ADV signal are activated to a low level, and inactivates the page signal pagez to a low level in synchronization with the activation of a precharge signal prez. The precharge signal prez is a signal which is activated in response to the inactivation of the /CE signal in order to set bit lines BL and /BL described later to a precharge voltage. Accordingly, the page signal pagez is activated to a high level in response to the first access command during the activation of the /CE signal, and is held at a high level during the activation of the /CE signal, and is inactivated to a low level in response to the inactivation of the /CE signal. The page signal pagez is used in order to distinguish between the first access command (normal access command) supplied during the activation of the /CE signal and the second and subsequent access commands (page access command), as described later.

The operation control circuit 14 has first and second latency counters 34 and 36, a latency control circuit 38, and a burst length counter 40. The first latency counter 34 operates when the pagez signal is at a low level and is the counter for determining the activation timing (the number of clock cycles) of a normal column enable signal clenz and a normal data enable signal dtenz. The second latency counter 36 operates when the pagez signal is at a high level and is the counter for determining the activation timing (the number of clock cycles) of a page column enable signal clenpz and a page data enable signal dtenpz. The latency counters 34 and 36 reset the counter value in synchronization with the activation of a burst end signal blendz from the burst length counter 40. The clenz signal, the dtenz signal, the clenpz signal, and the dtenpz signal are inactivated in synchronization with the reset of the counter value.

The latency control circuit 38 outputs a column clock signal clkclz (a column control signal, a data control signal) in synchronization with the clock CLK during the activation of the clenz signal or clenpz signal, and outputs a data clock signal clkdtz (data control signal) in synchronization with the clock CLK during the activation of the dtenz signal and dtenpz signal. The burst clock signal clkblz is outputted in synchronization with the column clock signal clkclz.

The burst length counter 40 carries out a count operation in synchronization with the clkblz signal from the latency control circuit 38 during the activation of the /CE signal, and outputs a blendz signal (pulse signal) when having counted the number of clocks corresponding to a preset burst length. The burst length counter 40 resets the counter value in synchronization with a birstz signal from the latency counter 36. Here, the burst length is the number of times of inputting of a data which is received at a data terminal DQ in response to one write access command, and is the number of times of outputting of a data which is outputted from the data terminal DQ in response to one read access command. The burst length can be set to, for example, any one of "two", "four", and "eight" by changing the set value of a non-illustrated configuration register.

The address buffer 16 receives a row address RAD and outputs the received address RAD to the address latch circuit 26. The address buffer 18 receives a column address CAD and outputs the received address CAD to the address latch circuit 28. The FCRAM of this embodiment is a semiconductor memory of an address non-multiplex type which receives the row address RAD and the column address CAD at once at the mutually different address terminals RAD and CAD. The data input/output buffer 20 receives a write data via the data terminal DQ and outputs the received data to a data bus DB. Moreover, the data input/output buffer 20 receives a read data from the memory cell MC via the data bus DB and outputs the received data to the data terminal DQ.

The address control circuit 22 outputs a row address latch signal ralatz (pulse signal) in synchronization with the CLK signal when the page signal pagez is inactivated and the /CE signal and /ADV signal are activated. That is, the ralatz signal is outputted in response to only the normal access command which is the first access command after the /CE signal is activated. The address control circuit 24 outputs a column address latch signal calatz (pulse signal) in synchronization with the CLK signal when the /CE signal and /ADV signal are activated to a low level. That is, the calatz signal is outputted in response to each access command (normal access command and page access command).

The address latch circuit 26 (row address input circuit) latches the row address RAD in synchronization with the ralatz signal, the row address RAD being supplied from the address buffer 16, and outputs the latched address to a row decoder RDEC as an internal row address raz. The row address RAD is supplied in order to select a word line WL. The address latch circuit 28 (column address input circuit) latches the column address CAD in synchronization with the calatz signal, the column address CAD being supplied from the address buffer 18, and outputs the latched address to a column decoder CDEC as an internal column address caz. The column address CAD is supplied in order to select the bit lines BL and /BL.

The memory core 30 has the row address decoder RDEC, the column address decoder CDEC, a sense amplifier SA, a column switch CSW, a read amplifier RA, a write amplifier WA, and a memory cell array ARY. The memory cell array ARY includes dynamic memory cells MC, and word lines WL as well as bit line pairs BL and /BL which are connected to the dynamic memory cells MC. The memory cell MC is formed at the intersection between the word line WL and the bit line pair BL and /BL.

The row address decoder RDEC decodes the row address raz from the address latch circuit 26 in order to select any one of the word lines WL. The column address decoder CDEC decodes the column address caz from the address latch circuit 28 in order to select the bit line pairs BL and /BL with a number corresponding to the number of bits of the data terminal DQ. The sense amplifier SA amplifies a difference in the signal amounts of the data signals which are read to the bit line pair BL and /BL. The column switch CSW connects the bit lines BL and /BL corresponding to the column address caz to the read amplifier RA and write amplifier WA in synchronization with the clkclz signal (pulse signal). The column switch CSW operates as a data input/output circuit which inputs/outputs data from/to the memory core corresponding to the clkclz signal.

The read amplifier RA amplifies complementary read data outputted via the column switch CSW during the read access operation. The write amplifier WA amplifies complementary write data supplied via the data bus DB and supplies to the bit line pair BL and /BL during the write access operation.

The data control circuit 32 latches a write data received sequentially at the data terminal DQ in synchronization with the clkdtz signal and outputs the latched data to the memory core 30 during the write access operation. Moreover, the data control circuit 32 latches a read data outputted from the memory core 30 in synchronization with the clkdtz signal and outputs the latched data to the data bus DB during the read access operation. The data control circuit 32 operates as a data input/output circuit which inputs/outputs data from/to the memory core 30 corresponding to the clkdtz signal.

Figure 2:
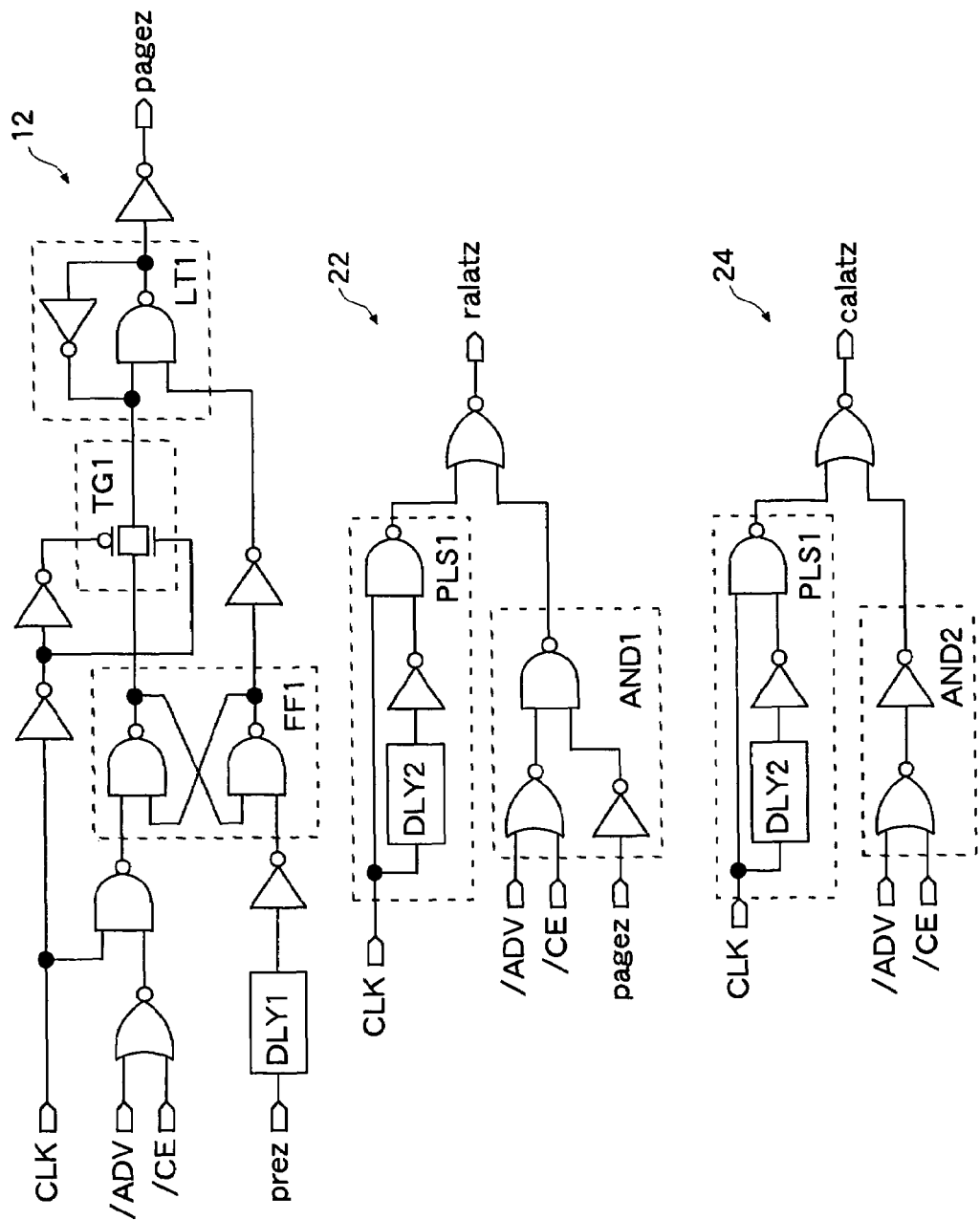
FIG. 2 is a block diagram showing the details of a page control circuit and an address control circuit shown in FIG. 1.

FIG. 2 shows the details of the page control circuit 12 and the address control circuits 22 and 24 shown in FIG. 1. The page control circuit 12 includes a delay circuit DLY1, a flip-flop FF1, a CMOS transfer gate TG1, and a latch circuit LT1, and logic gates connected to these circuits. The flip-flop FF1 is set in synchronization with an access command (CLK=a high logic level, and /ADV, /CE=a low logic level), and is reset in synchronization with a signal which is a precharge signal prez delayed by the delay circuit DLY1. The CMOS transfer gate TG1 transmits the output of the flip-flop FF1 to the latch circuit LT1 during a low level period of the clock CLK. The latch circuit LT1 latches the output of the flip-flop FF1 and outputs the latched logic level as the pagez signal.

The address control circuit 22 includes a pulse generator PLS1 which generates a negative pulse signal synchronized with the rising edge of the clock CLK, an AND circuit AND1 with three inputs which detects the normal access command, and a NOR gate which outputs the ralatz signal in synchronization with a negative pulse signal when having detected the normal access command. The address control circuit 24 includes an AND 20 circuit AND2 with two inputs in place of the AND circuit AND1 of the address control circuit 22. That is, the address control circuit 24 is formed by deleting the logic of the pagez signal from the logic of the address control circuit 22. The address control circuit 24 outputs the calatz signal in synchronization with the rising edge of the clock CLK when having detected the normal access command and page access command.

Figure 3:
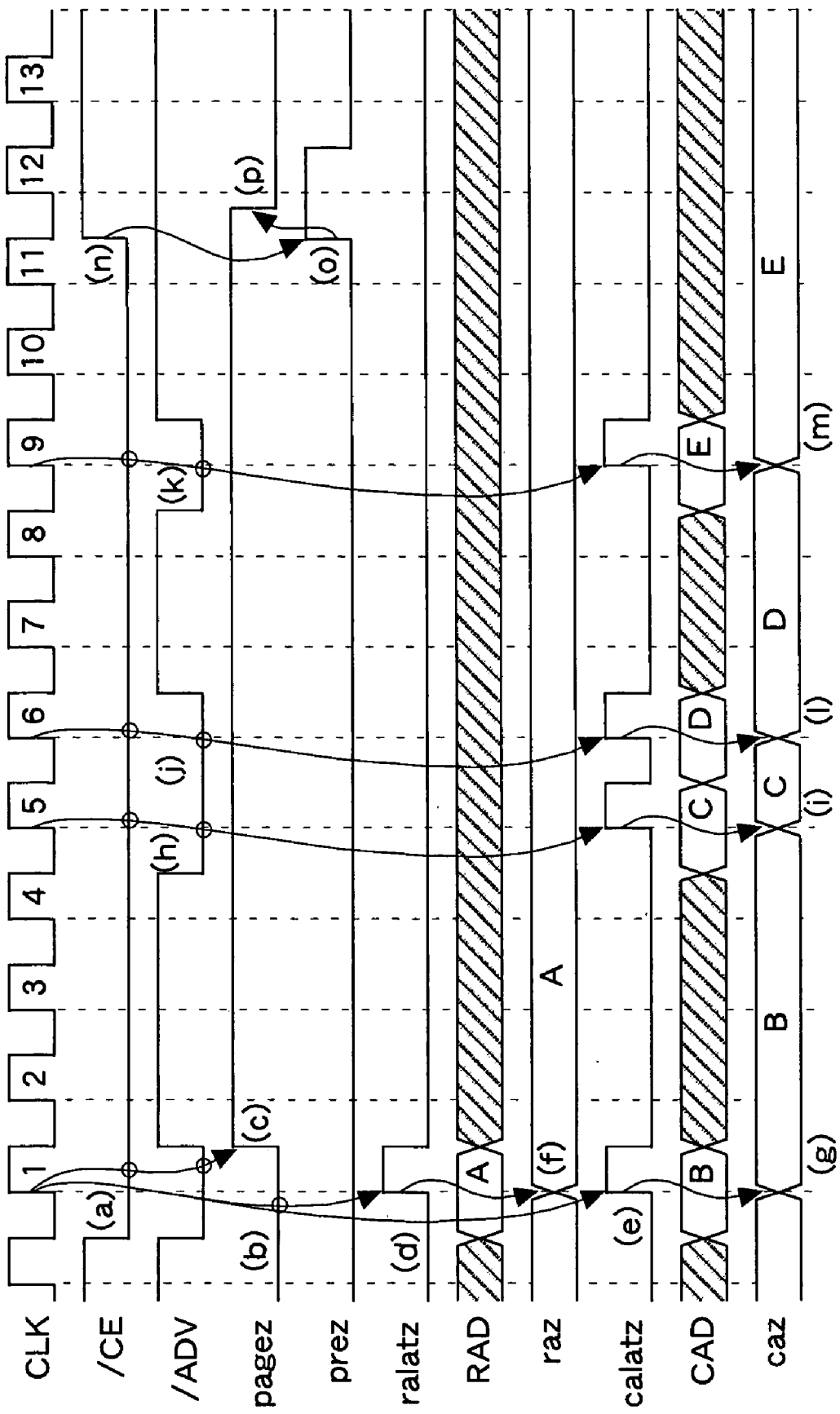
FIG. 3 is a timing chart showing the operation of the page control circuit and the address control circuit shown in FIG. 1.

FIG. 3 shows the operation of the page control circuit 12 and address control circuits 22 and 24 shown in FIG. 1. FIG. 3 shows the operation common in the write access operation and in the read access operation. First, in synchronization with a first clock CLK, the /CE signal is activated and the first access command is supplied (FIG. 3(*a*)). Because at this time the pagez signal is inactivated to a low level (FIG. 3(*b*)), this command is the normal access command. The page control circuit 12 activates the pagez signal in response to a supply of the normal access command (FIG. 3(*c*)).

Because of the normal access command, the both address control circuits 22 and 24 operate, and the ralatz signal and calatz signal are activated for approximately a half clock period (FIG. 3(*d, e*)). The address latch circuit 26 shown in FIG. 1 latches a row address RAD (A) in synchronization with the ralatz signal (FIG. 3(*f*)). The address latch circuit 28 latches a column address CAD (B) in synchronization with the calatz signal (FIG. 3(*g*)). Then, the normal write access operation or the normal read access operation is carried out.

Next, in synchronization with the fifth clock CLK, the second access command is supplied (FIG. 3(*h*)). Because at this time the pagez signal is activated to a high level, this command is the page access command. Accordingly, only the calatz signal is activated and the ralatz signal is not activated. Then, in synchronization with the calatz signal, a column address CAD (C) is latched (FIG. 3(*i*)), and the page write access operation or the page read access operation is carried out. Because the row address RAD is prevented from being latched in response to a supply of the page access command, it can be prevented that during the page operation the row address RAD changes and the FCRAM malfunctions.

Subsequently, in synchronization with the sixth and ninth clocks CLK, the third and fourth access commands are supplied, respectively (FIG. 3(*j, k*)). Because the pagez signal is activated to a high level, this command is the page access command. In this way, the access command which is supplied continuously during the activation of the /CE signal is recognized as the page access command except the first access command. For this reason, only the calatz signal is activated, and column, addresses CAD (D, E) are latched, respectively, in synchronization with the calatz signal (FIG. 3(l, m)).

Next, during the eleventh clock cycle the /CE signal is inactivated (FIG. 3(n)). In synchronization with the inactivation of the /CE signal, the prez signal is activated and a precharge operation is carried out (FIG. 3(o)). The page control circuit 12 shown in FIG. 2 inactivates the pagez signal in response to the activation of the prez signal (FIG. 3(p)). Then, the access period of the FCRAM ends.

In this way, the FCRAM latches the row address RAD and the column address CAD during the inactivation of the pagez signal, and carries out the normal access operation (the first access operation), and during the activation of the pagez signal it receives only the column address CAD and carries out the page access operation (the second access operation). In the first access operation, the row operation which activates the word line WL in response to an access command in order to read data from the memory cell MC to the bit line BL, and the column operation which outputs data, which is read to the bit lines BL and /BL, to the outside of the FCRAM via the data terminal DQ, are carried out continuously. On the other hand, in the second access operation, only the column operation is carried out and so-called a page operation is carried out. The page operation is an operation which inputs/outputs data continuously from/to the memory cell MC connected to this word line WL by changing only column address CAD while a certain word line WL is activated. Because the data transfer rate to the FCRAM can be improved by carrying out the page operation, the operation efficiency of the FCRAM will improve.

The two access operations can be carried out using the same access command by monitoring the logic level of the pagez signal. Therefore, a dedicated terminal does not need to be formed in the FCRAM in order to carry out the two operation cycles. Because the page operation function can be given to the FCRAM of a clock synchronization type without forming a dedicated terminal, a dedicated terminal does not need to be formed in the controller which accesses the FCRAM. Because a controller does not need to be newly developed, the operation efficiency of the FCRAM can be improved without increasing the cost of a system with the FCRAM.

Figure 4:
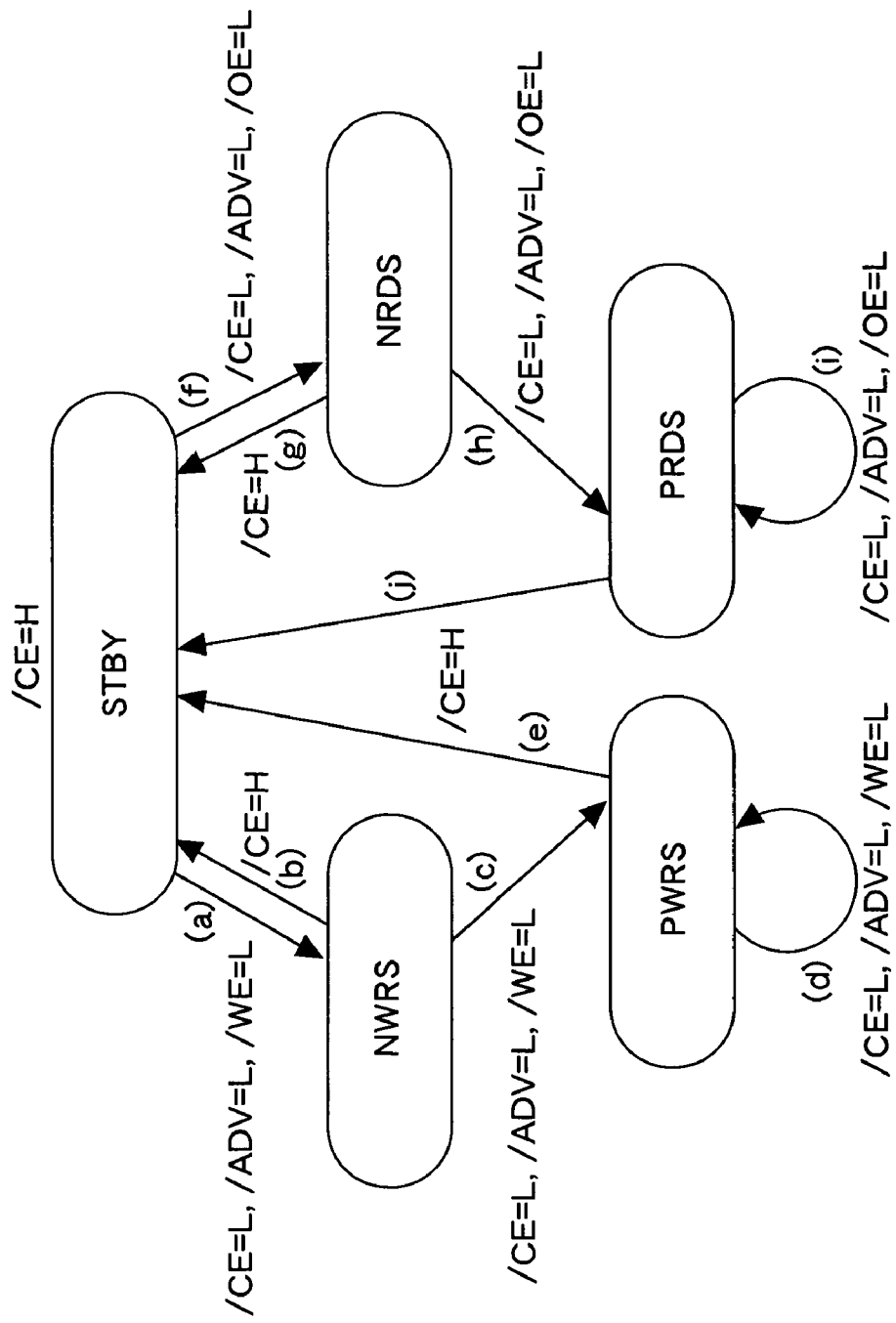
FIG. 4 is a state transition diagram showing the operation of an FCRAM of the first embodiment.

FIG. 4 shows the transition of the operation state of the FCRAM of the first embodiment. The FCRAM transits to a standby state STBY when the /CE signal is at a high level H. When the /CE signal, /ADV signal, and /WE signal change to a low level L during the standby state STBY, the FCRAM will detect the normal write access command (normal access command) and transits to a normal write state NWRS (FIG. 4(a)). At this time, the FCRAM receives the row address RAD and the column address CAD and carries out the normal write access operation. Upon detection of a high level H of the /CE signal during the normal write state NWRS, the FCRAM will return to the standby state STBY (FIG. 4(b)).

When the /CE signal, /ADV signal, and /WE signal change to a low level L during the normal write state NWRS, the FCRAM detects the page write access command (page access command) and transits to a page write state PWRS (FIG. 4(c)). At this time, the FCRAM receives only the column address CAD and carries out the page write access operation. Upon detection of the page write access command again during the page write state PWRS, the FCRAM receives only the column address CAD and carries out the page write access operation (FIG. 4(d)). Upon detection of a high level H of the /CE signal during the page write state PWRS, the FCRAM returns to the standby state STBY (FIG. 4(e)). The details of the normal write access operation and page write access operation will be described in FIG. 5 later.

On the other hand, when the /CE signal, /ADV signal, and /OE signal change to a low level L during the standby state STBY, the FCRAM detects the normal read access command (normal access command) and transits to a normal read state NRDS (FIG. 4(f)). At this time, the FCRAM receives the row address RAD and, the column address CAD and carries out the normal read access operation. Upon detection of a high level H of the /CE signal during normal read state NRDS, the FCRAM returns to the standby state STBY (FIG. 4(g)).

When the /CE signal, /ADV signal, and /OE signal change to a low level L during the normal read state NRDS, the FCRAM detects the page read access command (page access command) and transits to a page read state PRDS (FIG. 4(h)). At this time, the FCRAM receives only the column address CAD and carries out the page read access operation. Upon detection of the page read access command again during the page read state PRDS, the FCRAM receives only the column address CAD and carries out the page read access operation (FIG. 4(i)). Upon detection of a high level H of the /CE signal during the page read state PRDS, the FCRAM returns to the standby state STBY (FIG. 4(j)). The details of the normal read access operation and page read access operation will be described in FIG. 6 later.

As shown in FIG. 4, in the present invention, even when receiving the same access command, a state to transit differs corresponding to the state of the FCRAM. Which state to transit, the state NRDS or the state PRDS, and which state to transit, the state NWRS or the PWRS, are determined corresponding to the logic level of the pagez signal.

Figure 5:
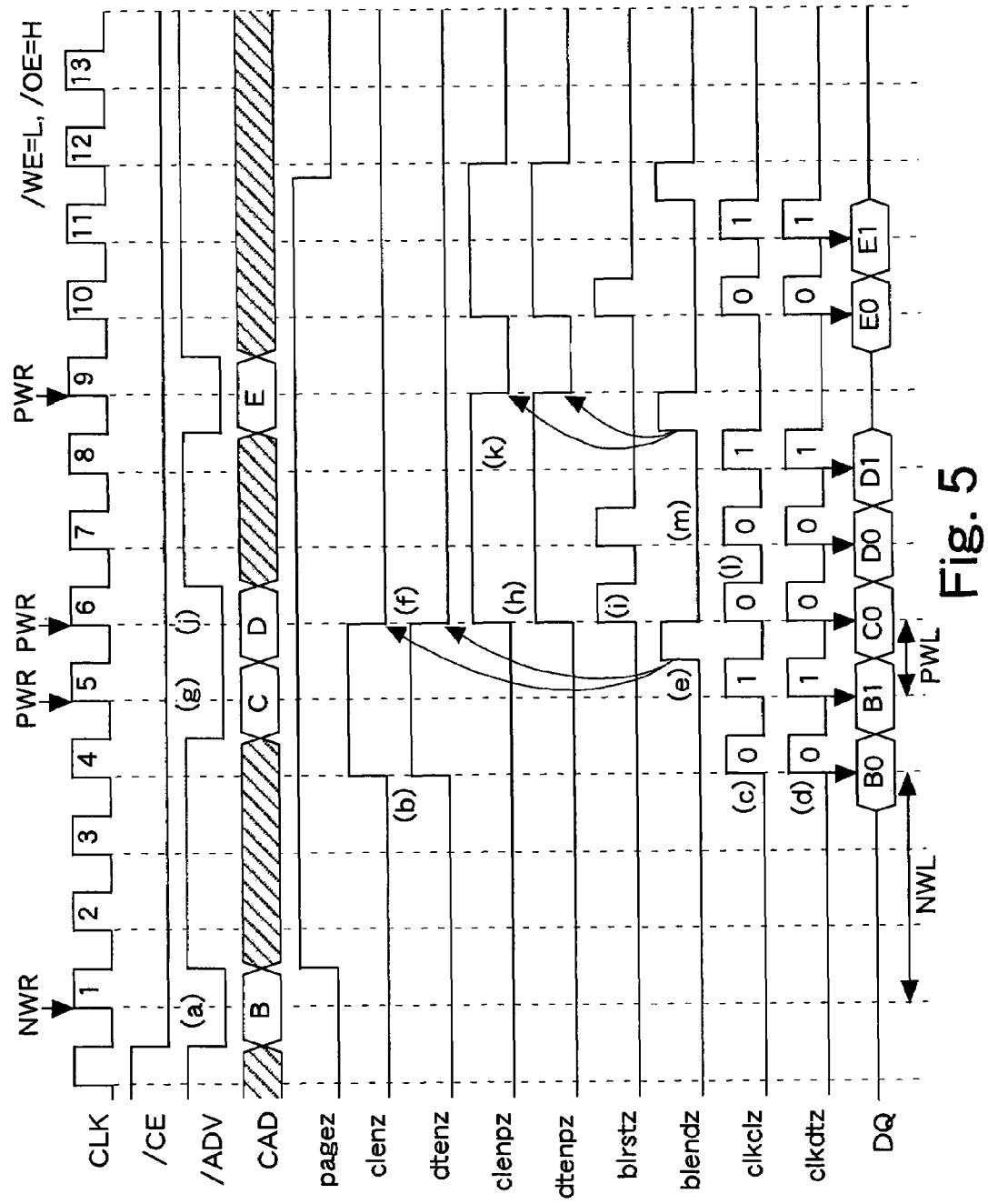
FIG. 5 is a timing chart showing a write access operation of the FCRAM of the first embodiment.

FIG. 5 shows the write access operation of the FCRAM of the first embodiment. The reception timings of the external signals /CE, /ADV, CAD, and RAD (RAD is not shown) are the same as those of FIG. 3 described above except that the /CE signal is activated in the eleventh and subsequent clock cycles. That is, in this example, the normal write access command NWR is supplied in synchronization with the first clock CLK, and the page write access command PWR is supplied in synchronization with the fifth, sixth, and ninth clock CLK.

Because the normal write access operation which responds to the normal write access command NWR requires a selection operation of the word line WL and an amplification operation by the sense amplifier SA, the write latency, which is the number of clock cycles from the write access command until receipt of the data DQ, requires "three (first latency)." On the other hand, because the page write access operation which responds to the page write access command PWR just needs to input/output data which is latched in the sense amplifier SA, the latency is "one (second latency)." The burst length which is the number of times of receipt of the write data DQ is set to "two", the write data DQ being received at the data terminal DQ in response to one write access command.

The access command supplied in synchronization with the first clock CLK is the normal write access command NWR (FIG. 5(a)). For this reason, the latency counter 34 used for the normal access shown in FIG. 1 operates and the latency counter 36 used for the page access does not operate. The latency counter 34 has been reset to "zero" by the blendz signal at the completion of the preceding access operation (write access operation or read access operation). The latency counter 34 starts the count operation of the clock CLK in response to receipt of the normal write access command NWR, and activates the normal enable signals clenz and dtenz after three clocks which correspond to the normal write latency NWL (FIG. 5(b)).

During the activation of the clenz signal and the dtenz signal, the clkclz signal and the clkdtz signal are outputted in synchronization with the clock CLK, respectively (FIG. 5(c, d)). The number of pulses of the clkclz signal and clkdtz signal to be generated is "two" which correspond to the burst length. The numbers "zero" and "one" shown in the waveform of the clkclz signal and clkdtz signal indicate the counter value of the burst length counter 40. The first and second time captures of the data DQ are shown. The write data DQ is captured in synchronization with a pulse of the clkdtz signal and is outputted to the memory core 30. The column switch CSW is turned on in synchronization with a pulse of the clkclz signal, and the write data DQ is written to the memory cell MC. In the write access cycle, in both the normal access operation and the page access operation, the output timings (clock cycles) of the clkclz signal arid clkdtz signal are the same as each other. However, the column switch CSW operates in synchronization with a signal which is the clkclz signal delayed slightly. The write data DQ can be surely written to the memory cell MC by delaying the on-timing of the column switch CSW slightly from the latch timing of the write data DQ by the data control circuit 32.

After a pulse of the second clkclz signal is outputted, the blendz signal indicating receipt of the data of the number corresponding to the burst length is outputted (FIG. 5(e)). The latency counter 34 resets the counter value in synchronization with the blendz signal and inactivates the clenz signal and the dtenz signal (FIG. 5(f)). Accordingly, the outputting of the clkclz signal and clkdtz signal is prohibited, and the write access operation of the data corresponding to the normal write access command NWR is completed.

The access command supplied in synchronization with the fifth clock CLK is the page write access command PWR (FIG. 5(g)). Accordingly, the latency counter 36 used for the page access shown in FIG. 1 operates and the latency counter 34 used for the normal access does not operate. The latency counter 36 is reset to "zero" by the blendz signal which is outputted during the normal write access operation. The latency counter 36 starts the count operation of the clock CLK in response to receipt of the page write access command PWR and activates the page enable signals clenpz and dtenpz after one clock which corresponds to the page write latency PWL (FIG. 5(h)). Moreover, before starting the page write access operation, the blrstz signal is activated in response to receipt of the page write access command PWR (FIG. 5(i)), and the counter value of the burst length counter 40 is reset to "zero".

During the activation of the clenpz signal and dtenpz signal, the clkclz signal and the clkdtz signal are outputted in synchronization with the clock CLK, respectively, and the page write access operation is carried out. However, in this example, the next page write access command PWR is supplied in synchronization with the sixth clock CLK (FIG. 5(j)). Because the clenpz signal and the dtenpz signal are already activated, the latency counter 36 holds the activated state of the clenpz signal and dtenpz signal until the blendz signal is outputted (FIG. 5(k)). Because the blrstz signal is activated in response to receipt of the page write access command PWR, the counter value of the burst length counter 40 is reset to "zero" (FIG. 5(l)). Accordingly, the write access operation corresponding to the fifth clock CLK is interrupted after writing the write data DQ once to the memory core 30. The blendz signal is not activated because the counter value of the burst length counter 40 is not "one" (FIG. 5(m)).

In response to the page write access command PWR corresponding to the sixth clock CLK, the clkclz signal and the clkdtz signal are activated twice (FIG. 5(n)), and the write data DQ is written to the memory cell MC. Subsequently, the page write access operation corresponding to the ninth clock CLK is carried out like the page write access operation described above.

Figure 6:
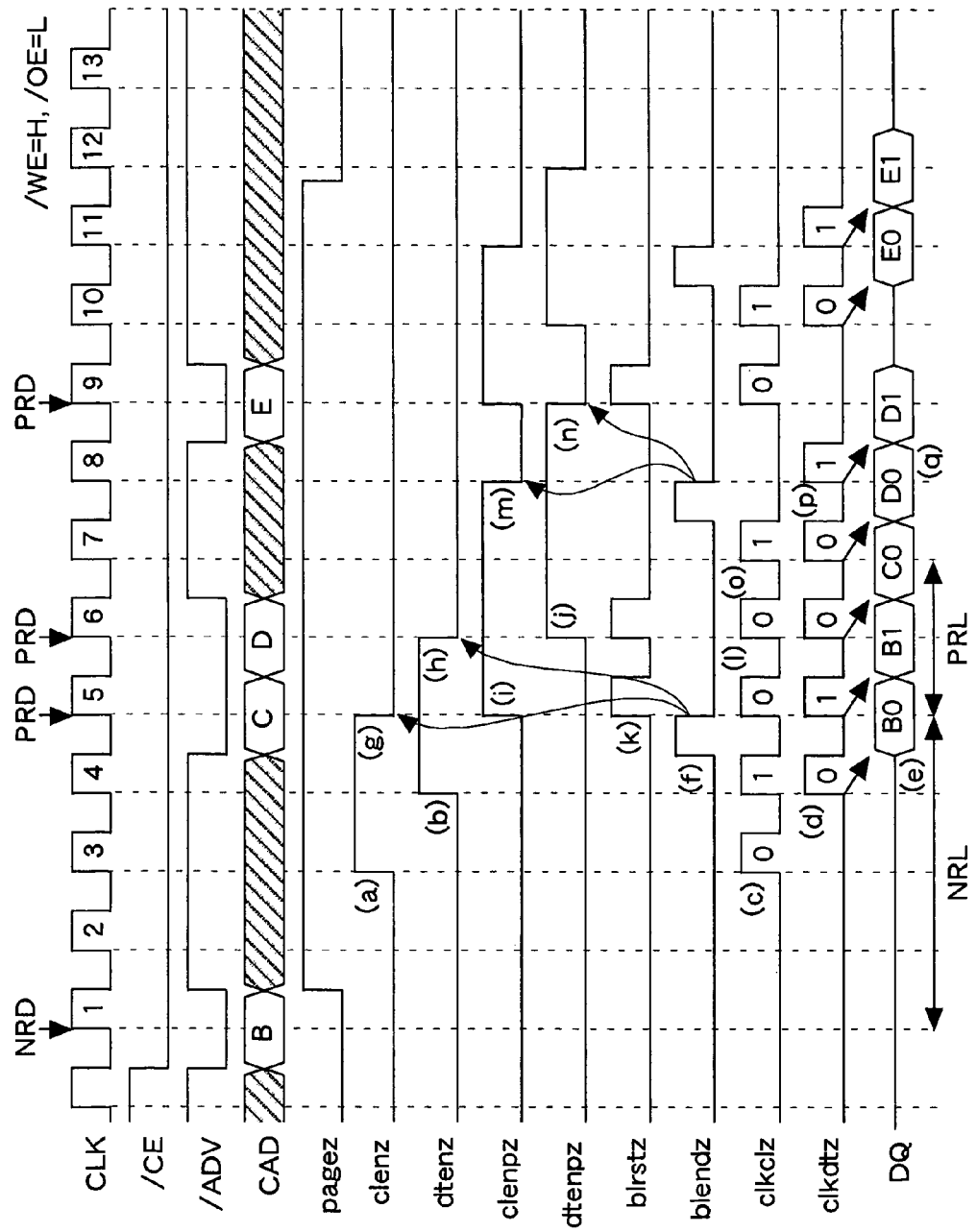
FIG. 6 is a timing chart showing a read access operation of the FCRAM of the first embodiment.

FIG. 6 shows the read access operation of the FCRAM of the first embodiment. The reception timing of the external signals /CE, /ADV, CAD, and RAD (RAD is not shown) are the same as those of FIG. 3 described above except that the /CE signal is activated in the eleventh and subsequent clock cycles. That is, in this example, the normal read access command NRD is supplied in synchronization with the first clock CLK, and the page read access command PRD is supplied in synchronization with the fifth, sixth, and ninth clocks CLK.

Like the write access operation described in FIG. 5, in the normal read access operation responding to the normal read access command NRD, the read latency which is the number of clock cycles from a read access command until output of the data DQ requires "four (first latency)." The latency of the page read access operation responding to the page read access command PRD is "two (second latency)." The burst length which is the number of times of outputting of the read data DQ is set to "two", the read data DQ being outputted from the data terminal DQ in response to one read access command. The detailed description of the same operation as that of FIG. 5 is omitted.

In response to the normal read access command NRD corresponding to the first clock CLK, the latency counter 34 activates a normal enable signal clenz after two clocks, which are fewer than the normal read latency NRL (="4") by "two", and activates a normal enable signal dtenz after three clocks, which are fewer than the normal read latency NRL by "one" (FIG. 6(a, b)). That is, the clenz signal and the dtenz signal are activated after a predetermined number of clocks corresponding to the normal read latency NRL.

During the activation of the clenz signal, the clkclz signal is outputted in synchronization with the clock CLK (FIG. 6(c)). In synchronization with the clkclz signal, the column switch CSW is turned on and a read data latched in the sense amplifier SA is outputted to the data control circuit 32. In a similar manner, during the activation of the dtenz signal, the clkdtz signal is outputted in synchronization with the clock CLK (FIG. 6(d)). Then, in synchronization with the clkdtz signal, the read data is outputted from the data terminal DQ via the data control circuit 32 and data output buffer 20 (FIG. 6(e)).

After a pulse of the second clkclz signal is outputted, the blendz signal is outputted (FIG. 6(f)). The clenz signal is inactivated in synchronization with the blendz signal (FIG. 6(g)). The dtenz signal is inactivated after one clock from output of the blendz signal (FIG. 6(h)). Accordingly, the clenz signal and the dtenz signal are activated during two clock cycles which correspond to the burst length, respectively.

In response to the page read access command PRD corresponding to the fifth clock CLK, the latency counter 36 activates a page enable signal clenpz after "zero" clock, which is fewer than the page read latency PRL (="2") by "two", and activates a page enable signal dtenpz after one clock, which is fewer than the normal read latency NRL by "one" (FIG. 6(i, j)).

That is, the clenpz signal and the dtenpz signal are activated after a predetermined number of clocks which correspond to the page read latency PRL. Moreover, before starting the page read access operation, the birstz signal is activated in response to receipt of the page read access command PRD (FIG. 6(k)), and the counter value of the burst length counter 40 is reset to "zero".

The outputting of the clkclz signal and clkdtz signal, and the associated page read access operation are the same as those of the normal read access operation except an interruption by the page read access command PRD corresponding to the sixth clock CLK. The blrstz signal is activated in response to receipt of the page read access command PRD and the counter value of the burst length counter 40 is reset to "zero" (FIG. 6(*l*)).

In response to the page read access command PRD corresponding to the sixth clock CLK, the latency counter 36 holds the activated state of the clenpz signal until the blendz signal is outputted, and holds the activated state of the dtenpz signal from output of the blendz signal until after one clock (FIG. 6(*m, n*)). Then, during the activation of the clenpz signal and dtenpz signal, the clkclz signal and the clkdtz signal are outputted twice, respectively (FIG. 6(*o, p*)), and the read data is outputted from the data terminal DQ in a similar manner described above (FIG. 6(*q*)). Then, the page read access operation corresponding to the ninth clock CLK is carried out like the page read access operation described above.

As shown in FIG. 5 and FIG. 6, the normal write latency NWL (=3) and the normal read latency NRD (=4) differ from each other, and the page write latency PWL (=1) and the page read latency PRD (=2) differ from each other. Accordingly, the number of clock cycles until the clenz signal is activated differs from each other in the write access operation and in the read access operation. Moreover, the number of clock cycles until the clenpz signal is activated differs from each other in the write access operation and in the read access operation. Furthermore, in the read access operation, the number of clock cycles until the clenz signal and the dtenz signal are activated differs from each other, and the number of clock cycles until the clenpz signal and the dterrpz signal are activated differs from each other.

As described above, in the first embodiment, the row operation with more latency and the column operation (page operation) with less latency can be selectively carried out using the same access command without using a dedicated terminal. The transfer rate of a data with respect to the FCRAM can be improved because the page operation can be made executable without forming a dedicated terminal. As a result, the operation efficiency of the FCRAM can be improved without increasing the cost of a system with the FCRAM.

The pagez signal is activated in response to the normal access commands NWR and NRD by the page control circuit 12, and one of the latency counters 34 and 36 is selectively operated corresponding to the logic level of the pagez signal, and the clkclz signal and the clkdtz signal are generated by the latency control circuit 38 using the normal enable signals clenz and dtenz as well as the page enable signals clenpz and dtenpz outputted from the latency counters 34 and 36, thereby allowing the first and second access operations to be switched by a simple circuit. Accordingly, by adding a minor change to an already developed FCRAM, the FCRAM of the present invention can be realized and the design period of the FCRAM can be reduced.

The address control circuit 22 which operates upon receipt of the pagez signal outputs the ralatz signal for latching the row address RAD in response to only the normal access commands NWR and NRD. In other words, when the page access commands PWR and PRD are supplied, the ralatz signal is not outputted and the row address RAD is not latched. Therefore, it can be prevented that the row address RAD changes and the FCRAM malfunctions during the page operation.

Figure 7:
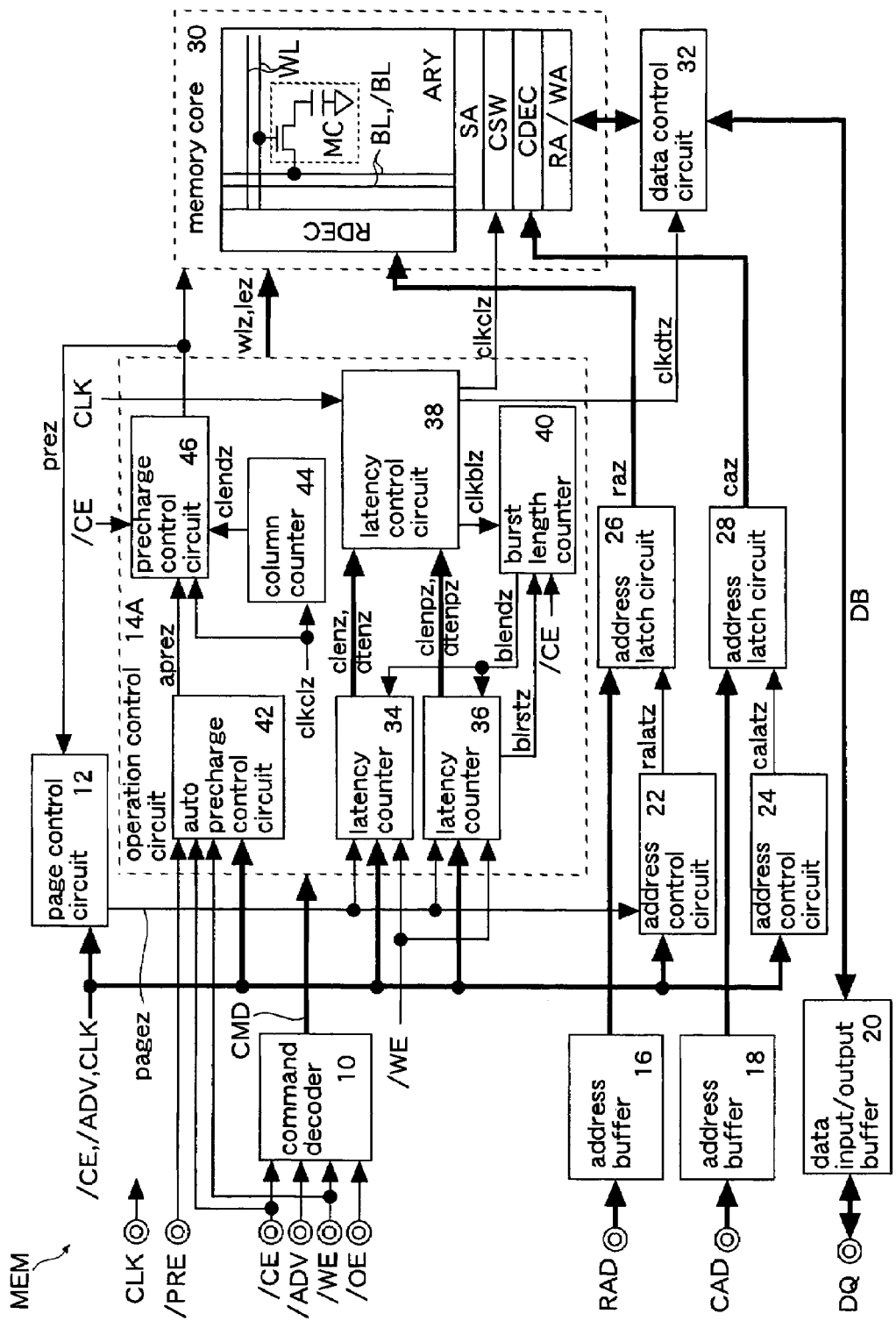
FIG. 7 is a block diagram showing a second embodiment of the present invention.

FIG. 7 shows a second embodiment of the present invention. For the same elements as the elements described in the first embodiment, the same symbols are given and the detailed description of these elements is omitted. In this embodiment, the function to receive a write access command with an auto precharge and a read access command from the outside is added to the FCRAM of the first embodiment. For this reason, the FCRAM has a precharge terminal /PRE. Moreover, an operation control circuit 14A is formed in place of the operation control circuit 14 of the first embodiment. Other configuration is the same as that of the first embodiment.

The operation control circuit 14A is formed by adding an auto precharge control circuit 42, a column counter 44, and a precharge control circuit 46 to the operation control circuit 14 of the first embodiment. Upon receipt of an auto precharge command, the auto precharge control circuit 42 activates an auto precharge signal aprez after the preceding access operation is completed. The auto precharge command is recognized when the auto precharge signal /PRE of a low level along with the page access command is received at the precharge terminal /PRE. The activation timing of the aprez signal differs between when the write access operation is carried out immediately before and when the read access operation is carried out immediately before.

The column counter 44 counts pulses of the clkclz signal of the number corresponding to the burst length for each access command, and outputs a column end signal clendz in synchronization with the clkclz signal corresponding to the last burst operation. Specifically, the clendz signal is activated for one clock period in synchronization with the falling edge of the preceding clkclz signal of the last burst operation. The precharge control circuit 46 outputs the prez signal in synchronization with the clkclz signal when the clendz signal and the aprez signal are activated.

Figure 8:
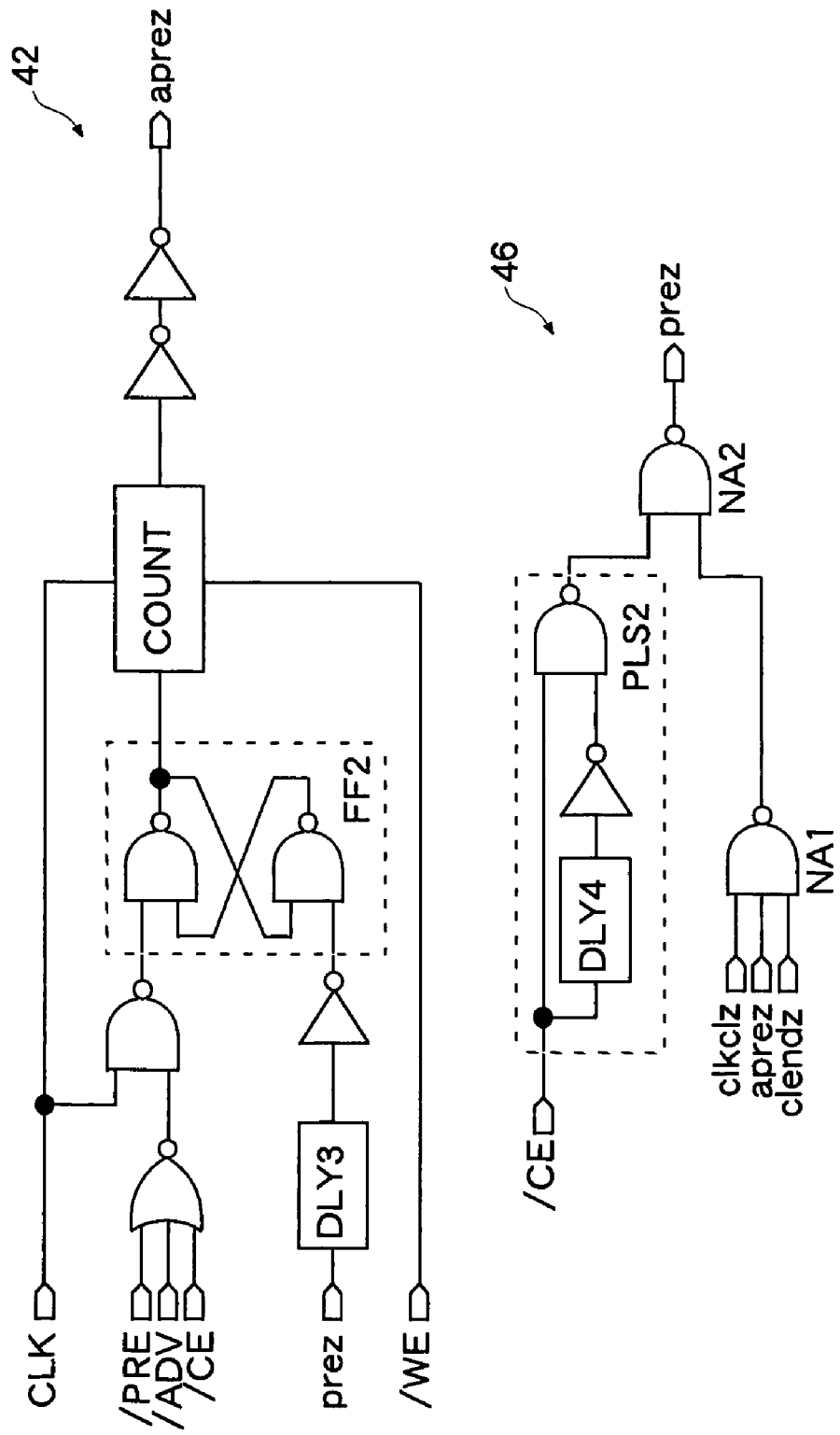
FIG. 8 is a block diagram showing the details of an auto precharge control circuit and a precharge control circuit shown in FIG. 7.

FIG. 8 shows the details of the auto precharge control circuit 42 and the precharge control circuit 46 shown in FIG. 7. The auto precharge control circuit 42 includes a delay circuit DLY3, a flip-flop FF2, and a counter COUNT, and logic gates connected to these circuits. The flip-flop FF2 is set in synchronization with the auto-precharge command (CLK=a high logic level, and /PRE, /ADV; /CE=a low logic level), and is reset in synchronization with a signal which is the precharge signal prez delayed by the delay circuit DLY2. The counter COUNT counts a predetermined number of clocks in response to the set of the flip-flop FF2, and outputs a signal for activating the aprez signal after the count. The predetermined number of clocks differs between when the write access operation is carried out immediately before and when the read access operation is carried out immediately before. Accordingly, the counter COUNT distinguishes by the /WE signal between the write access operation and the read access operation, and determines the number of clocks to count.

The precharge control circuit 46 includes a pulse generator PLS2 which generates a negative pulse signal synchronized with the rising edge of the /CE signal, a NAND gate NA1 which detects the activation of the clendz signal, aprez signal, and clkclz signal, and a NAND gate NA2 (OR gate in negative logic) which operates an OR logic of the output of the pulse generator PLS2 and the output of the NAND gate NA1. The prez signal is outputted in synchronization with the rising edge of the /CE signal or with the auto precharge command.

Figure 9:
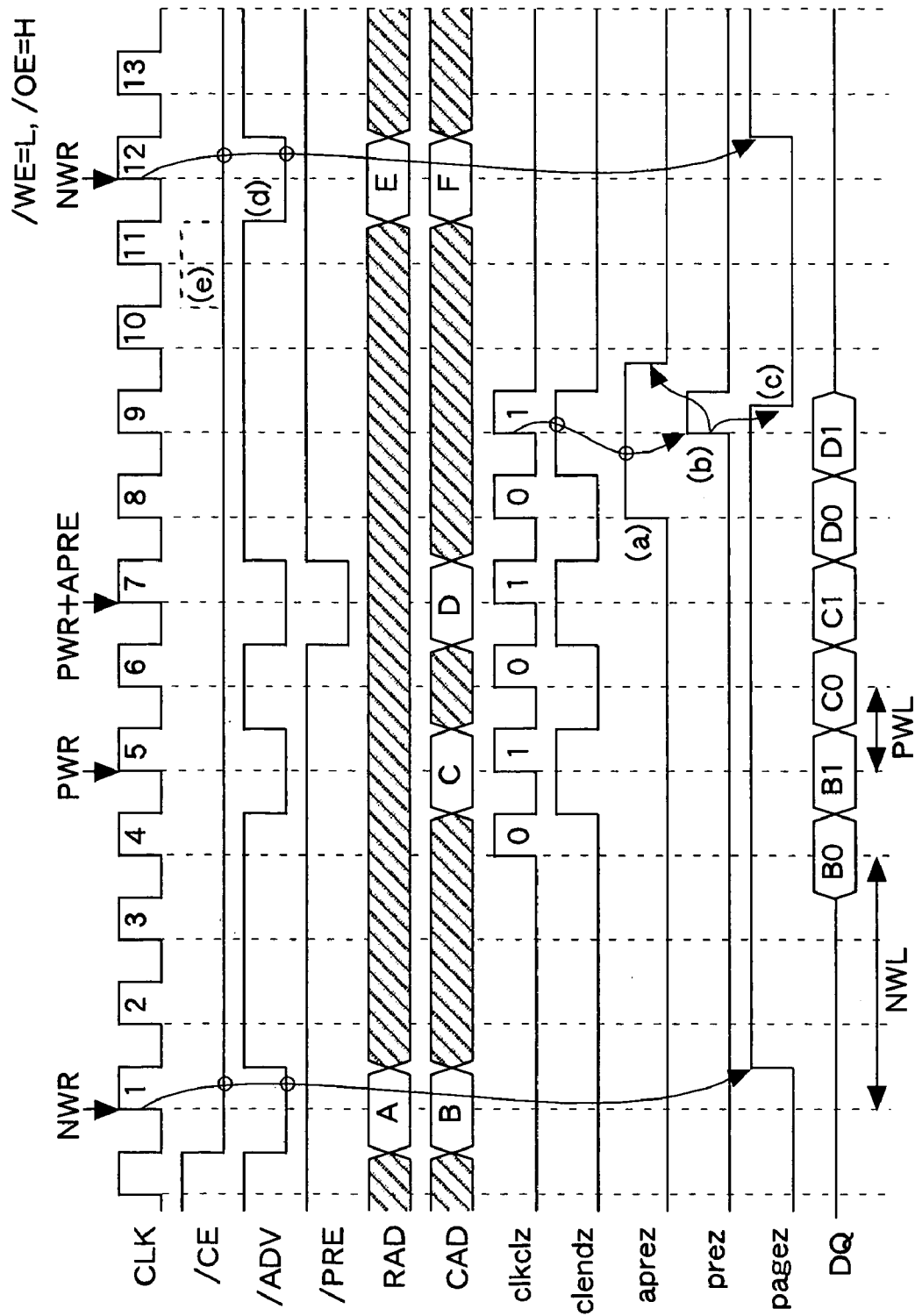
FIG. 9 is a timing chart showing a write access operation of an FCRAM of the second embodiment.

FIG. 9 shows the write access operation of the FCRAM of the second embodiment. In this example, the normal write access command NWR is supplied in synchronization with the first clock CLK, and the page write access command PWR is supplied in synchronization with the fifth clock CLK, and the page write access command PWR including the auto precharge command APRE is supplied in synchronization with the seventh clock CLK, and the normal write access command NWR is again supplied in synchronization with the twelfth clock CLK. The fundamental operation of the FCRAM is the same as that of the first embodiment. That is, the burst length is "two", and the normal write latency NWL and the page write latency PWL are "three" and "one", respectively. The detailed description of the same operation as that of FIG. 5 described above is omitted.

When the auto precharge command APRE is supplied in synchronization with the seventh clock CLK; the aprez signal is activated after the page write access operation of the memory core 30 corresponding to the fifth clock CLK is completed (FIG. 9(a)). Here, the page write access operation of the memory core 30 is completed in the seventh clock cycle in which the second clkclz signal is activated. Accordingly, the aprez signal is activated in synchronization with the eighth clock CLK. Then, the prez signal is activated in synchronization with the last clkclz signal (FIG. 9(b)) and the precharge operation is carried out. The pagez signal is inactivated in synchronization with the activation of the prez signal, and the page write access operation is completed (FIG. 9(c)). The write access command supplied in synchronization with the twelfth clock CLK is recognized as the normal write access command NWR because the pagez signal is at a low level (FIG. 9(d)). Without no auto precharge function, the /CE signal needs to be once inactivated in synchronization with the eleventh clock CLK as shown as the dashed line in the waveform of the /CE signal (FIG. 9(e)).

In this way, in this embodiment, the precharge operation can be carried out by using the auto precharge command APRE without inactivating the /CE signal. Without auto precharge function, the /CE signal needs to be once inactivated in synchronization with the tenth clock CLK as shown as the dashed line in the waveform of the /CE signal of the view. In this case, the precharge operation is delayed, resulting in delay of supply of the next access command.

Figure 10:
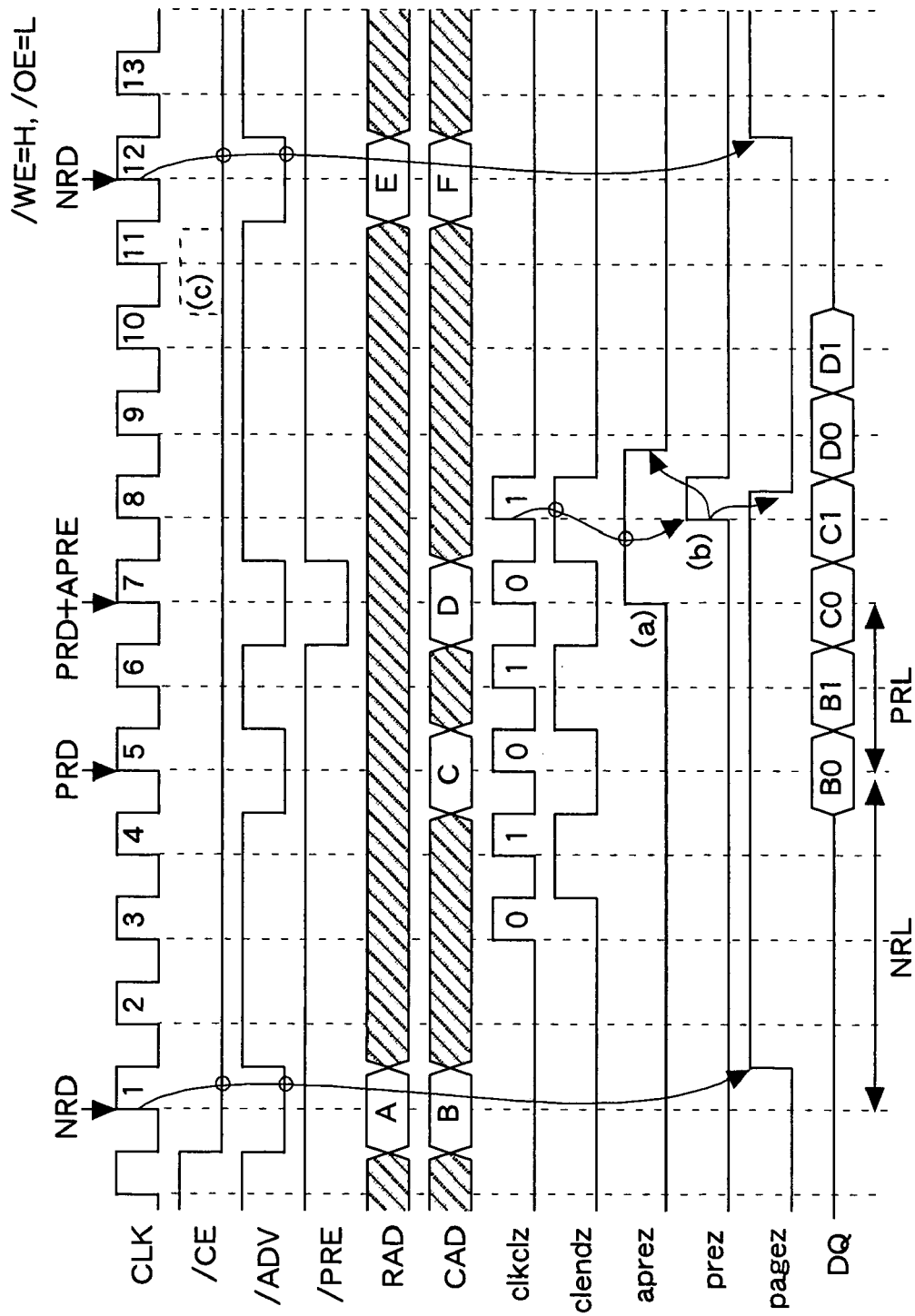
FIG. 10 is a timing chart showing a read access operation of the FCRAM of the second embodiment.

FIG. 10 shows the read access operation of the FCRAM of the second embodiment. In this example, the normal read access command NRD is supplied in synchronization with the first clock CLK, and the page read access command PRD is supplied in synchronization with the fifth clock CLK, and the page read access command PRD including the auto precharge command APRE is supplied in synchronization with the seventh clock CLK, and the normal read access command NRD is again supplied in synchronization with the twelfth clock CLK. The fundamental operation of the FCRAM is the same as that of the first embodiment. That is, the burst length is "two", and the normal read latency NRL and the page read latency PRL are "four" and "two", respectively. The detailed description of the same operation as that of FIG. 6 and FIG. 9 described above is omitted.

In the read access operation, the page read access operation of the memory core 30 corresponding to the preceding page read access command PRD has already been completed when the auto precharge command APRE is received. Specifically, the page read access operation of the memory core 30 is completed in the sixth clock cycle in which the second clkclz signal is activated. Accordingly, the aprez signal is activated in synchronization with the clock CLK which responds to the auto precharge command APRE (FIG. 10(a)). Then, as same as FIG. 9, the prez signal is activated in synchronization with the last clkclz signal (FIG. 10(b)) and the precharge operation is carried out. Also in the read access operation, the precharge operation can be carried out by using the auto precharge command APRE without inactivating the /CE signal. As same as FIG. 9, without no auto precharge function, the /CE signal needs to be once inactivated in synchronization with the eleventh clock CLK as shown as the dashed line in the waveform of the /CE signal (FIG. 10(c)).

As described above, also in the second embodiment, the same effect as that of the first embodiment described above can be obtained. Furthermore, the precharge operation can be carried out immediately after the completion of the column operation because in this embodiment the precharge operation can be carried out without inactivating the /CE signal. As a result, the access operation which responds to the next access command can be started earlier, allowing the data transfer rate to be improved.

Figure 11:
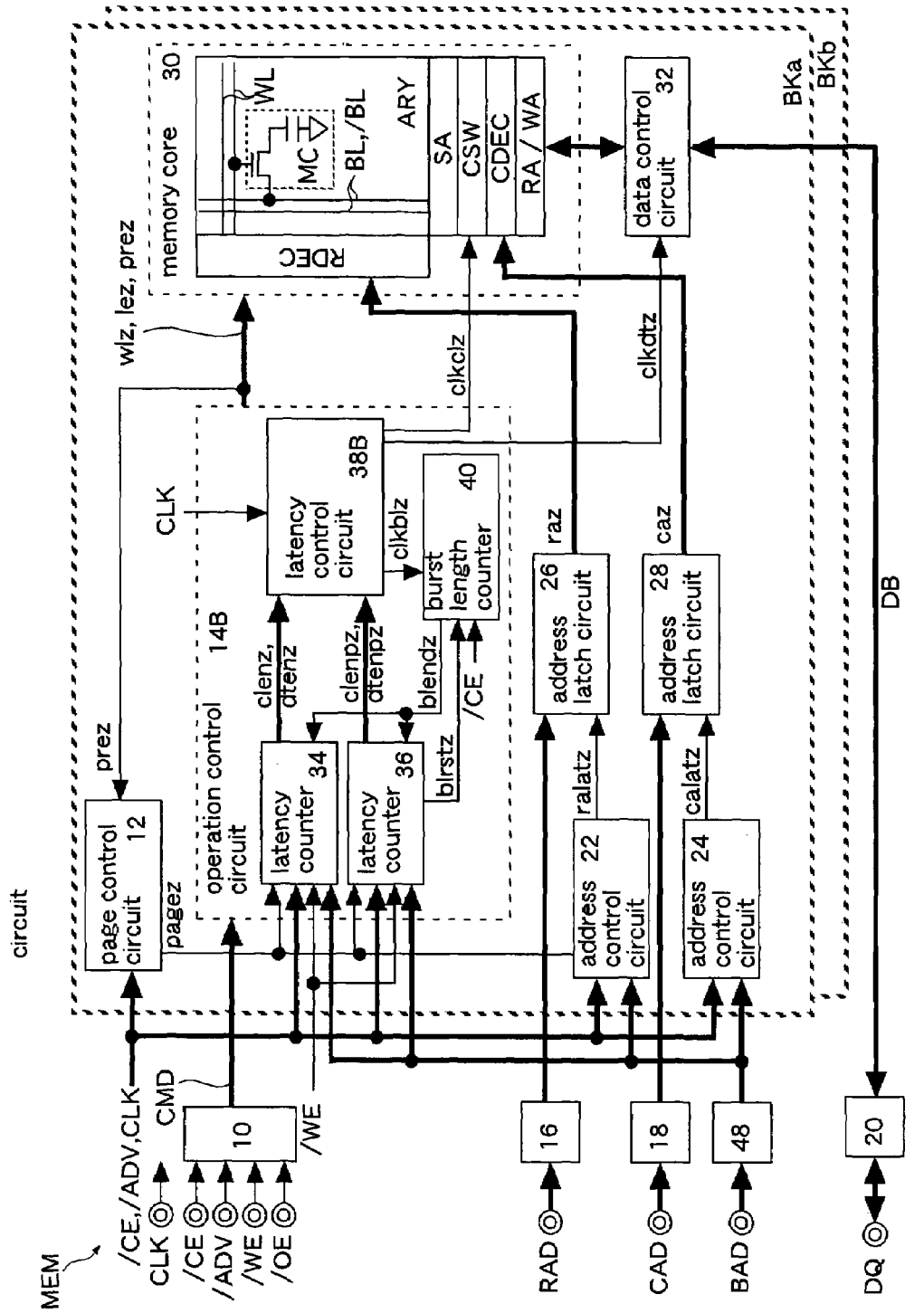
FIG. 11 is a block diagram showing a third embodiment of the present invention.

FIG. 11 shows a third embodiment of the present invention. The same symbols are given and to the same elements as the elements described in the first embodiment, the detailed description of these elements is omitted. In this embodiment, the FCRAM includes a bank address terminal BAD which receives a bank address BAD, and an address buffer 48 which receives a bank address BAD. Moreover, the FCRAM has two banks BKa and BKb being operable independently of each other. Other configuration is the same as that of the first embodiment.

The banks BKa and BKb each have an operation control circuit 14B in place of the operation control circuit 14 of the first embodiment. The operation control circuit 14B has a latency control circuit 38B in place of the latency control circuit 38 of the first embodiment. Other configuration of each of the banks BKa and BKb is the same as that of the first embodiment. In FIG. 11, "a" is given to the end of a control signal of the operation control circuit 14B of the bank BKa, and "b" is given to the end of a control signal of the operation control circuit 14B of the bank BKb.

Figure 12:
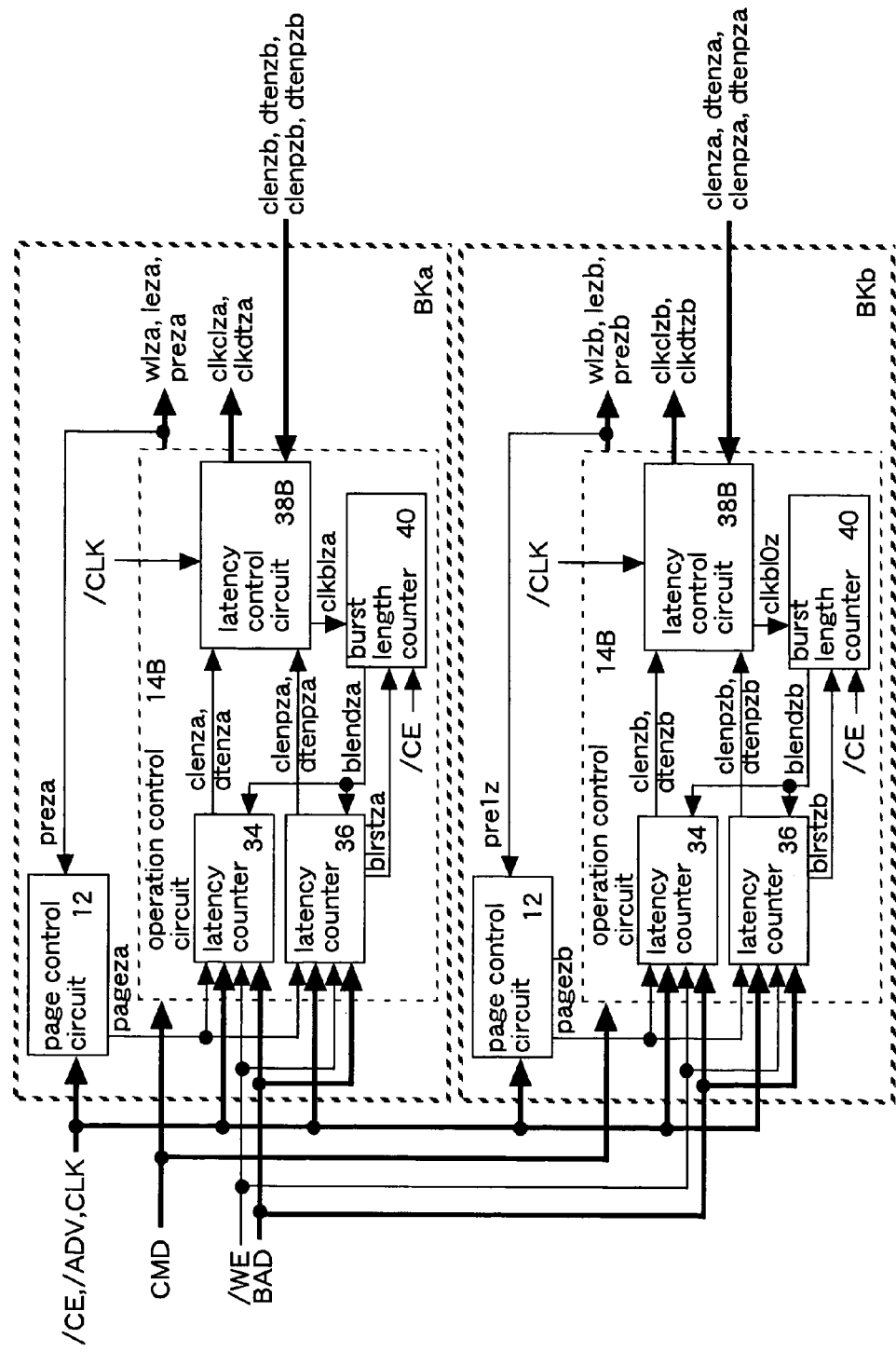
FIG. 12 is a block diagram showing the details of an operation control circuit shown in FIG. 11.

FIG. 12 shows the details of the operation control circuit 14B shown in FIG. 11. The latency control circuit 38B of the bank BKa receives a clenzb signal, a dtenzb signal, a clecpzb signal, and a dtenpzb signal outputted from the operation control circuit 14B of the bank BKb, and prohibits the outputting of a clenza signal and a dtenza signal when the bank BKb inputs or outputs the data DQ. In a similar manner, the latency control circuit 38B of bank BKb receives a clenza signal, a dtenza signal, a clecpza signal, and a dtenpza signal outputted from the operation control circuit 14A of the bank BKa, and prohibits the outputting of a clenzb signal and a dtenzb signal when the bank BKa inputs or outputs the data DQ. Accordingly, even when the banks BKa and BKb operate concurrently, the data DQ can be prevented from colliding to each other. That is, the circuit configuration shown in FIG. 12 can realize the so-called bank interleaving operation.

Figure 13:
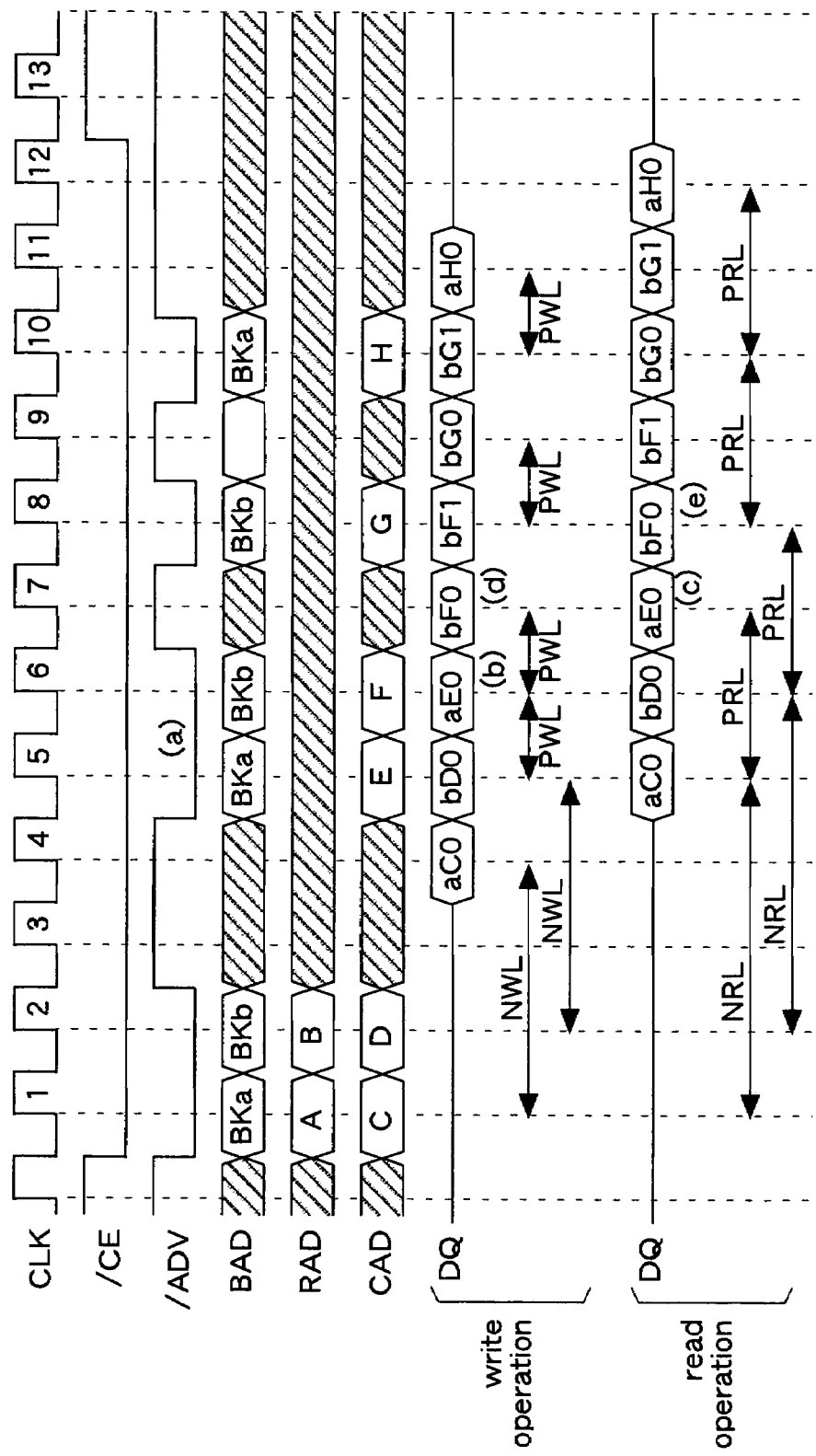
FIG. 13 is a timing chart showing the access operation of an FCRAM of the third embodiment.

FIG. 13 shows the access operation of the FCRAM of the third embodiment. The fundamental operation of the FCRAM is the same as that of the first embodiment. That is, the burst length is "two", and the normal write latency NWL and the page write latency PWL are "three" and "one", respectively. The normal read latency NRL and the page read latency PRL are "four" ahd "two", respectively. The detailed description of the same operation as that of the first embodiment is omitted.

In this embodiment, the FCRAM operates in response to the bank address BAD as well as a normal access command NWD (or NRD) and a page access command PWD (or PRD). When page access commands with mutually different column addresses CAD are supplied continuously in synchronization with the fifth and sixth clocks CLK (FIG. 13(a)), the data DQ corresponding to the page access command supplied later is preferentially inputted (or outputted) under the control of the latency control circuit 38B shown in FIG. 12. In other words, the operation control circuit 14B of the bank BKa to be accessed earlier stops the outputting of the clenza signal and dtenza signal (data control signal) in response to the outputting of the clenzb signal and dtenzb signal (data control signal) by the operation control circuit 14B of the bank BKb to be accessed later. For this reason, in the burst operation, although the first data DQ of the bank BKa is inputted (or outputted) (FIG. 13(b, c)), the second data DQ is not inputted (or outputted). In place of the second data DQ, the data DQ corresponding to the page access command supplied later is inputted (or outputted) (FIG. 13(d, e)).

As described above, also in the third embodiment, the same effect as that of the first embodiment described above can be obtained. Furthermore, in this embodiment, even when a plurality of banks BKa and BKb operates concurrently, the data can be inputted/outputted via the data terminal DQ without collision. The operation efficiency can be improved without forming a dedicated terminal also in the FCRAM having a plurality of banks BKa and BKb.

Figure 14:
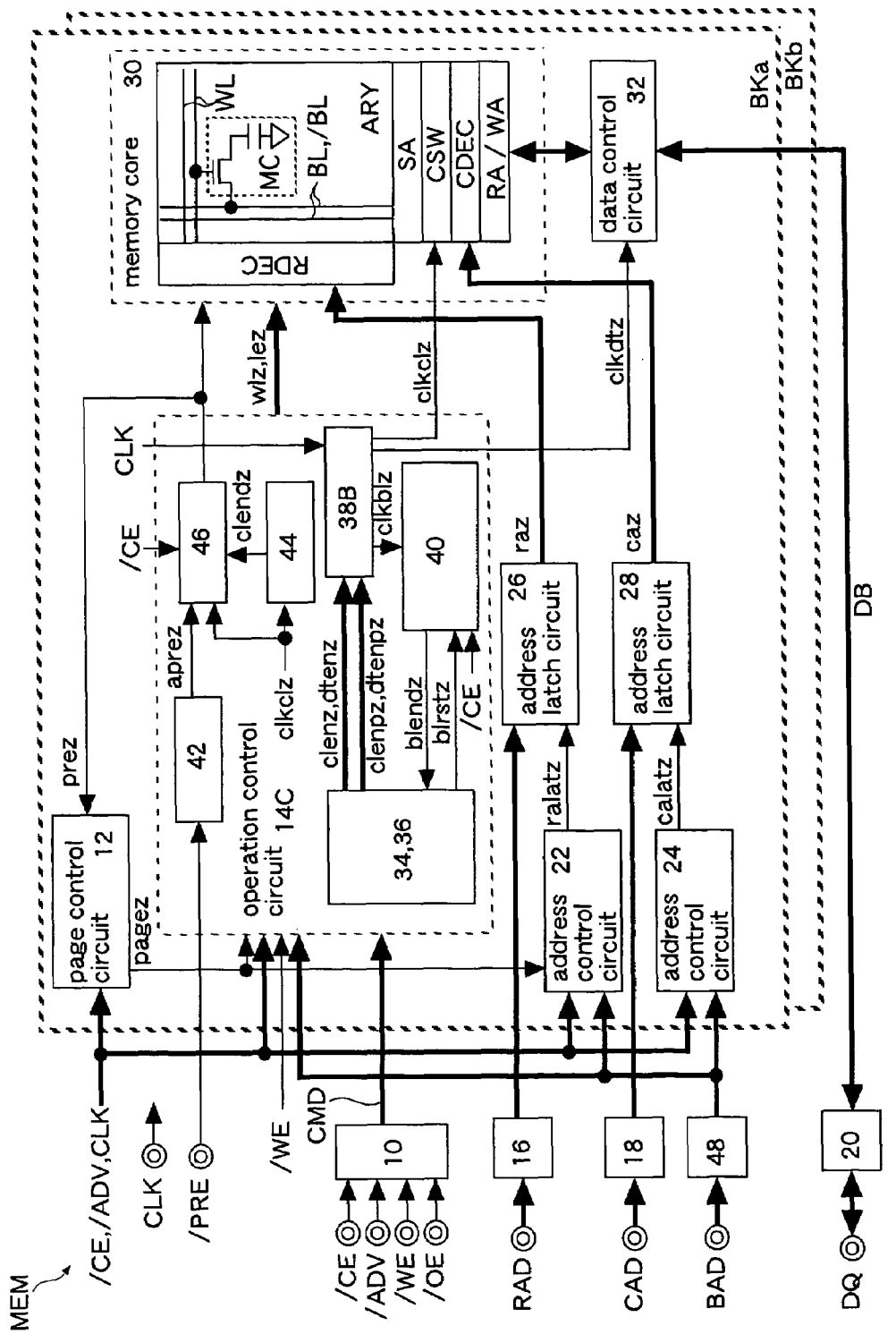
FIG. 14 is a block diagram showing a fourth embodiment of the present invention.

FIG. 14 shows a fourth embodiment of the present invention. For the same elements as the elements in the embodiments described above, the same symbols are given and the detailed description of these elements is omitted. In this embodiment, an operation control circuit 14C of each of the banks BKa and BKb has the auto precharge control circuit 42, the column counter 44, and the precharge control circuit 46 as same as in the second embodiment. The FCRAM has the precharge terminal /PRE for receiving the auto precharge signal /PRE (auto precharge command APRE). Other configuration is the same as that of the first embodiment.

In this embodiment, the auto precharge command APRE is supplied as well as the bank address BAD. Accordingly, only either one operation control circuit 14C of the banks BKa and BKb selected by the bank address BAD activates the precharge signal prez in response to the auto precharge command. That is, the precharge operation is independently carried out for each of the banks BKa and BKb. In contrast, when the precharge operation is carried out by the inactivation of the /CE signal, the precharge operation will be carried out concurrently in all the banks BKa and BKb.

As described above, also in the fourth embodiment, the same effect as the first and third embodiments described above can be obtained. Furthermore, in this embodiment, with the auto precharge signal /PRE and the bank address BAD, while carrying out the access operation to one of the banks BKa and BKb, the precharge operation can be carried out only to the other of the banks BKa and BKb. The access operation can be carried out efficiently and the data transfer rate can be improved because the precharge operation can be carried out independently in the banks BKa and BKb. That is, the access operation efficiency of the FCRAM can be improved.

In addition, the above embodiments have described examples in which the present invention is applied to the FCRAM. The present invention is not limited to such embodiments. For example, the present invention can be applied to a pseudo SRAM of a clock synchronization type.

In the second embodiment described above, an example is described in which the auto precharge command APRE as well as the page access commands PWR and PRD are supplied. The present invention is not limited to such embodiment. For example, the auto precharge command APRE can be supplied as well as the normal access commands NWR and NRD, and the precharge operation can be automatically carried out after the normal access operation.

In the third and fourth embodiments described above, examples are described in which the present invention is applied to the FCRAM having two banks BKa and BKb. The present invention is not limited to such embodiments. For example, the present invention can be applied to an FCRAM having four or more banks.

The invention is not limited to the above embodiments and various modifications may be made without departing from the spirit and scope of the invention. Any improvement may be made in part or all of the components.

What is claimed is:

1. A semiconductor memory, comprising:
a memory core having memory cells, and a word line and a bit line connected to the memory cells;
an enable terminal which receives a chip enable signal allowing access to said memory core;
a command terminal which receives an access command for carrying out an access operation to said memory core;
an address terminal which receives an address at once in accordance with said access command, the address being indicative of a memory cell to access; and
an operation control circuit which, during activation of said chip enable signal, carries out a first access operation upon receipt of a first access command, and carries out a second access operation upon receipt of a next access command, a second access operation time being shorter than a first access operation time,
wherein the operation control circuit includes:
a first latency counter which, upon receipt of said first access command, counts a number of clocks corresponding to a first latency to generate a data control signal for controlling input or output of data to or from said memory core; and
a second latency counter which, upon receipt of said next access command, counts a number of clocks corresponding to a second latency, which is less than the first latency, to generate the data control signal.

2. The semiconductor memory according to claim 1, further comprising a clock terminal which receives a clock.

3. The semiconductor memory according to claim 2, further comprising a data input/output circuit which inputs/outputs data from/to said memory core according to the data control signal.

4. The semiconductor memory according to claim 3, wherein
the first latency counter counts the number of clocks corresponding to the first latency and activates a normal enable signal after the counting,
the second latency counter counts the number of clocks corresponding to the second latency and activates a page enable signal after the counting; and
a latency control circuit outputs said data control signal during activation of said normal enable signal or said page enable signal.

5. The semiconductor memory according to claim 4, further comprising a page control circuit which activates a page signal in response to said first access command and inactivates said page signal in response to inactivation of said chip enable signal, wherein said first latency counter operates during the inactivation of said page signal and said second latency counter operates during the activation of said page signal.

6. The semiconductor memory according to claim 2, further comprising a plurality of banks each having said memory core, said operation control circuit, and a data input/output circuit which inputs/outputs data from/to said memory core according to a data control signal, respectively, the plurality of banks being operable independently of each other, wherein the operation control circuit of the bank to be accessed first stops outputting the data control signal in response to an output of the data control signal by the operation control circuit of the bank to be accessed next.

7. The semiconductor memory according to claim 6, further comprising:
a precharge terminal which receives an auto precharge signal; and
a bank address terminal which receives a bank address for selecting one of said banks,
wherein said operation control circuit corresponding to said bank address outputs a precharge signal for precharging said bit line, in response to said auto precharge signal received at said precharge terminal.

8. The semiconductor memory according to claim 2, wherein at least either one of said first or second latencies differs in a write access operation and a read access operation.

9. The semiconductor memory according to claim 1, further comprising;
a row address input circuit which receives a row address for selecting said word line, in synchronization with only said first access command, and outputs the received row address to said memory core; and
a column address input circuit which receives column addresses for selecting said bit line, in synchronization with said first access command and said next access command, respectively, and outputs the received column addresses to said memory core.

10. The semiconductor memory according to claim 1, further comprising a precharge terminal which receives an auto precharge signal, wherein said operation control circuit outputs a precharge signal for precharging said bit line, in response to said auto precharge signal received at said precharge terminal or an inactivation of said chip enable signal.

11. The semiconductor memory according to claim 1, wherein:
in said first access operation, a row operation and a column operation are carried out, the row operation being for activating said word line in response to said access command in order to read data on said bit line, the column operation being for outputting to an outside the data read on said bit line; and
in said second access operation only said column operation is carried out.

12. An operating method of a semiconductor memory, comprising:
receiving a chip enable signal allowing access to a memory core having memory cells, and a word line and a bit line connected to the memory cells;
receiving an access command for carrying out an access operation to said memory core;
receiving an address at once in response to said access command, the address being indicative of a memory cell to access;
during activation of the chip enable signal allowing access to the memory core, carrying out a first access operation upon receipt of the first access command, and carrying out a second access operation upon receipt of a next access command, a second access operation time being shorter than a first access operation time;
counting a number of clocks corresponding to a first latency, upon receipt of said first access command, to generate a data control signal for controlling input or output of data to or from said memory core; and
counting a number of clocks corresponding to a second latency, upon receipt of said next access command, to generate the data control signal, the second latency being less than the first latency.

13. The operating method of a semiconductor memory according to claim 12, further comprising inputting/outputting data from/to said memory core according to a data control signal,
wherein the semiconductor memory comprises a plurality of banks each having said memory core and an operation control circuit and being operable independently of each other; and
the operation control circuit of the bank to be accessed first stops outputting the data control signal in response to an output of the data control signal by the operation control circuit of the bank to be accessed next.

14. The operating method of a semiconductor memory according to claim 13, wherein the operation control circuit corresponding to a bank address outputs a precharge signal for precharging said bit line, in response to an auto precharge signal received at a precharge terminal, the bank address being received at a bank address terminal in order to select one of said banks.

15. The operating method of a semiconductor memory according to claim 12, wherein at least either one of said first or second latencies differs in a write access operation and a read access operation.

16. The operating method of a semiconductor memory according to claim 12, further comprising:
receiving a row address for selecting said word line, in synchronization with only said first access command to output the received row address to said memory core; and
receiving column addresses for selecting said bit line, in synchronization with said first access command and said next access command respectively to output the received column addresses to said memory core.

17. The operating method of a semiconductor memory according to claim 12, further comprising:
outputting a precharge signal which precharges said bit line in response to said auto precharge signal received at a precharge terminal or an inactivation of said chip enable signal.

18. The operating method of a semiconductor memory according to claim 12, wherein:
in said first access operation, a row operation and a column operation are carried out, the row operation being for activating said word line in response to said access command in order to read data on said bit line, and the column operation being for outputting to an outside the data read on said bit line; and
in said second access operation only said column operation is carried out.

* * * * *